United States Patent
Ka

(10) Patent No.: US 6,542,433 B2
(45) Date of Patent: Apr. 1, 2003

(54) COLUMN ADDRESS BUFFERING CIRCUIT

(75) Inventor: Soon-Taeg Ka, Kyoungki-do (KR)

(73) Assignee: Hynix Semiconductor Inc, Kyoungki-Do (KR)

( * ) Notice: Subject to any disclaimer, the term of this patent is extended or adjusted under 35 U.S.C. 154(b) by 0 days.

(21) Appl. No.: 10/035,733

(22) Filed: Dec. 26, 2001

(65) Prior Publication Data
US 2002/0105852 A1 Aug. 8, 2002

(30) Foreign Application Priority Data
Dec. 26, 2000 (KR) .............................. 00-82306

(51) Int. Cl.[7] ................................................. G11C 8/00
(52) U.S. Cl. ........................ 365/230.06; 365/189.05; 365/233; 365/233.5; 365/233.08
(58) Field of Search ................ 365/230.06, 189.05, 365/233, 233.5, 233.08

(56) References Cited
U.S. PATENT DOCUMENTS 6,163,498 A  * 12/2000 Moon .................... 365/230.06
6,359,828 B1 *  3/2002 La ........................ 365/230.06

* cited by examiner

Primary Examiner—Richard Elms
Assistant Examiner—Toan Le
(74) Attorney, Agent, or Firm—Marshall, Gerstein & Borun

(57) ABSTRACT

There is provided a column address buffering circuit for use in memory devices such as a DDR DRAM for receiving column addresses and internally buffering the column addresses. In the buffering process, the column address buffering circuit generates specific internal address signals having different paths according to a burst length before an address strobe signal is inputted thereto. Such an arrangement synchronizes the generation time of the specific internal address signals with those of other internal address signals by positioning a bit transition detecting unit related to generating the specific internal address signals corresponding to an odd cell and an even cell in front of an address latch for generating internal address signals at the same time of the address strobe signal being coupled.

8 Claims, 10 Drawing Sheets

COLUMN ADDRESS BUFFERING CIRCUIT

TECHNICAL FIELD

The present invention relates to a peripheral circuit for use with a synchronous semiconductor memory device and, more particularly, to a column address buffering circuit.

BACKGROUND

A double data rate synchronous dynamic random access memory (DDR SDRAM), which is recently emerging as a very high speed memory device, is an SDRAM in which data or instructions are inputted or outputted in synchronization with falling edges and rising edges of a clock signal. For instance, it is possible to obtain data corresponding to a clock signal of 200 megahertz (MHz) using both the rising and falling edges of a 100 MHz clock signal.

Like a conventional SDRAM, the DDR SDRAM performs a column access operation by using an internal clock signal aligned to rising edges of an external clock signal. To execute the column access operation synchronized to the rising edges and the falling edges of the external clock signal, the DDR SDRAM should employ a 2-bit prefetch scheme in which an access operation for rising data and falling data is performed in one clock cycle.

For example, if a column address '(A2, A1, A0)=(0, 0, 0)' is inputted when a burst length is 2 and a burst type is a sequential type, although, on the outside, it looks like data corresponding to addresses of (0, 0, 1), (0, 1, 0) and (0, 1, 1) are sequentially outputted, internally, access operations for the column addresses of (0, 0, 0) and (0, 0, 1) are simultaneously performed in one clock cycle and those for the column addresses of (0, 1, 0) and (0, 1, 1) are simultaneously executed in the next clock cycle.

Herein, the 'burst length' means a length of data continuously outputted from a clock synchronous memory device such as an SDRAM.

As described above, when the burst length is 2, two column addresses are internally processed as aligned to the external clock signal. Therefore, if a column address A1 is constant regardless of a least significant column address A0 having a logic low or a logic high state, the memory is merely required to internally process a most significant column address to the lower column address A1 regardless of the state of the least significant column address A0.

However, if a logic state of the column address A1 is differently generated according to the logic state of the least significant column address A0, internally, the column address A1 is processed differently according to the logic state of the least significant column address A0. For instance, if column addresses (A1, A0) are (0, 0), internal column addresses to be processed in a corresponding clock are (0, 0) and (0, 1). Further, if column addresses (A1, A0) are (1, 0), internal column addresses to be processed in the corresponding clock become (1, 0) and (1, 1). Therefore, in case the least significant column address A0 has a logic low state, its upper column address A1 is processed regardless of the logic state of the least significant column address A0.

However, if starting column addresses (A1, A0) are (0, 1) or (1, 1), column addresses to be simultaneously processed in a corresponding clock become (1, 0) and (0, 0) and the column address A1 should be internally inverted. That is, in case the least significant bit address A0 has a logic high state, an inverted column address of A1, which is generated through a separate process, should be used.

In general, for the 2-bit prefetch scheme, it is common to classify cells in a bank in a memory device into odd and even cells and to access the odd cells and the even cells separately. Therefore, the column address A1 of the odd cell is generated to have a logic state identical to that of an external input address signal while the column address A1 of the even cell is produced to have a logic state varying depending on a logic state of the least significant column address A0.

Referring to FIG. 1, a block diagram of a conventional column address buffering circuit is shown. The column address buffering circuit comprises a multiplicity of address buffers 10, 12, 14, a plurality of address latches 20, 22, 24 and a bit transition detecting unit 30 for detecting logic states of lower column addresses corresponding to a burst length and outputting address signals at1_od and at1_ev to access an odd cell and an even cell.

Referring to FIG. 2, a circuit diagram of the bit transition detecting unit 30 in FIG. 1 when the burst length is 2 is illustrated. The bit transition detecting unit 30 includes a control signal generating block 31 for producing control signals set and setb. The control signal generating block 31 includes a 3-input NAND gate NAND1 that receives an output signal at_col_0 of the address latch 20 (FIG. 1) and inverted signals of an input signal A generated according to the burst length and an input signal B produced according to a burst type (e.g., a sequential or an interleave type) and generates the control signal set and an inverter IN6 inverting the control signal set to thereby produce the inverted control signal setb.

The bit transition detecting unit 30 further includes an output block 32 for providing its following predecoder (not shown) with the address signals at1_od and at1_ev in response to the control signals set and setb. The output block 32 includes an inverter chain IN1 and IN2 for buffering the output signal at_col_1 of the address latch 20 to thereby output a column address signal at1_od for an odd cell. The output block 32 also includes two switching components MT1 and MT2 for selectively providing a following predecoder (not shown) with the output signal at_col_1 or an inverted signal of the output signal at_ col_1 as a column address signal at1_ev for an even cell in response to the control signals set and setb.

Hereinafter, the operation of the above column address buffering circuit will be described with reference to FIGS. 1 and 2.

First of all, the address buffers 10, 12, 14 receive and buffer a plurality of column addresses A0, A1, An, respectively, in response to an internal clock signal clkp4 and the address latches 20, 22, 24 receive signals out_0, out_1, out_n provided from the address buffers 10, 12, 14, respectively, and generate output signals at_col_0, at_col_1, at_col_n responsive to an enabled address strobe signal add_stb.

The bit transition detecting unit 30 is provided with the lower bit address signals, e.g., at_col_0 and at_col_1 when the burst length BL is 2, applicable to the burst length among the output signals at_col_0, at_col_1, at_col_n of the address latches 20, 22, 24, and determines whether or not inverting an upper bit address signal, e.g., A1 when BL is 2, according to a logic state of the lower bit address signal, e.g., A0 when BL is 2, thereby transferring output address signals at1_ev and at1_od to the following predecoder (not shown).

Referring to FIG. 3, there is provided an operational timing diagram of the address buffering circuit in FIG. 1. In FIG. 3, if column addresses A0 and A1 having the waveform of (a) and (b) are inputted, two signals out_0 and out_1 having the waveform of (d) and (e) are simultaneously generated in synchronization with a rising edge of an internally generated clock signal clkp4 having the waveform of (c).

Subsequently, if there is coupled an address strobe signal add_stb having the waveform of (f), which is a kind of internal clock control signals, the internal signals, e.g., at_col_2, at col_n, except the lower bit signals at_col_0 and at_col_1 corresponding to the burst length are generated in synchronization with the address strobe signal add_stb while the internal signals at1_ev and at1_od corresponding to the even cell and the odd cell, respectively, are outputted to have the waveform of (h) after being delayed for a certain delay time td by the bit transition detecting unit 30.

Meanwhile, an access time of data corresponding to the inputted column address is determined by the latest signal. Therefore, as described above, because the output address signals at1_ev and at1_od of the bit transition detecting unit 30 are generated in the end, the access time of the column addresses is decided by the generation time of the output address signals at1_ev and at_od.

In short, because the output address signals at1_ev and at1_od, which are a part of internal signals to be used in performing a column access operation after being provided to address predecoders, are delayed by the bit transition detecting unit 30 including two or more inverters. The internal address signals at1_ev and at1_od are generated as being delayed for the certain delay time after the address strobe signal add_stb is inputted. This results in the problem of delaying the column access time and, thus, substantially deteriorating the operational speed of the memory device.

SUMMARY

In accordance with one aspect, the disclosed column address buffering apparatus may include a plurality of address buffers for receiving and buffering column address signals to thereby output buffered column address signals and a bit transition detecting unit for receiving lower bit address signals corresponding to a burst length among the buffered column address signals and for selectively outputting a most significant bit address signal among the lower bit address signals or an inverted signal of the most significant bit address signal according to logic states of the rest of the lower bit address signals. The disclosed apparatus may also include a first address latch for supplying corresponding following predecoders with an output signal of the bit transition detecting unit in response to an address strobe signal and a second address latch for receiving buffered address signals which do not correspond to the burst length among the buffered address signals and providing corresponding following predecoders with the received buffered address signals in response to the address strobe signal.

In accordance with the disclosed apparatus, there is provided a column address buffering circuit for use in memory devices such as a DDR DRAM for receiving column addresses and internally buffering the column addresses. In the buffering process, the buffering circuit may generate specific internal address signals having different paths according to a burst length before an address strobe signal is inputted thereto so as to synchronize the generation time of the specific internal address signals with those of other internal address signals. As a result, it is possible to steeply shorten the column access time by removing an unnecessary time delay. That is, the inventive column address buffering circuit is configured to position a bit transition detecting unit related to generating the specific internal address signals corresponding to an odd cell and an even cell in front of an address latch for generating internal address signals at the same time of the address strobe signal being coupled, so that the specific internal address signals can be produced when the other internal address signals are generated.

DETAILED DESCRIPTION

Figure 1:
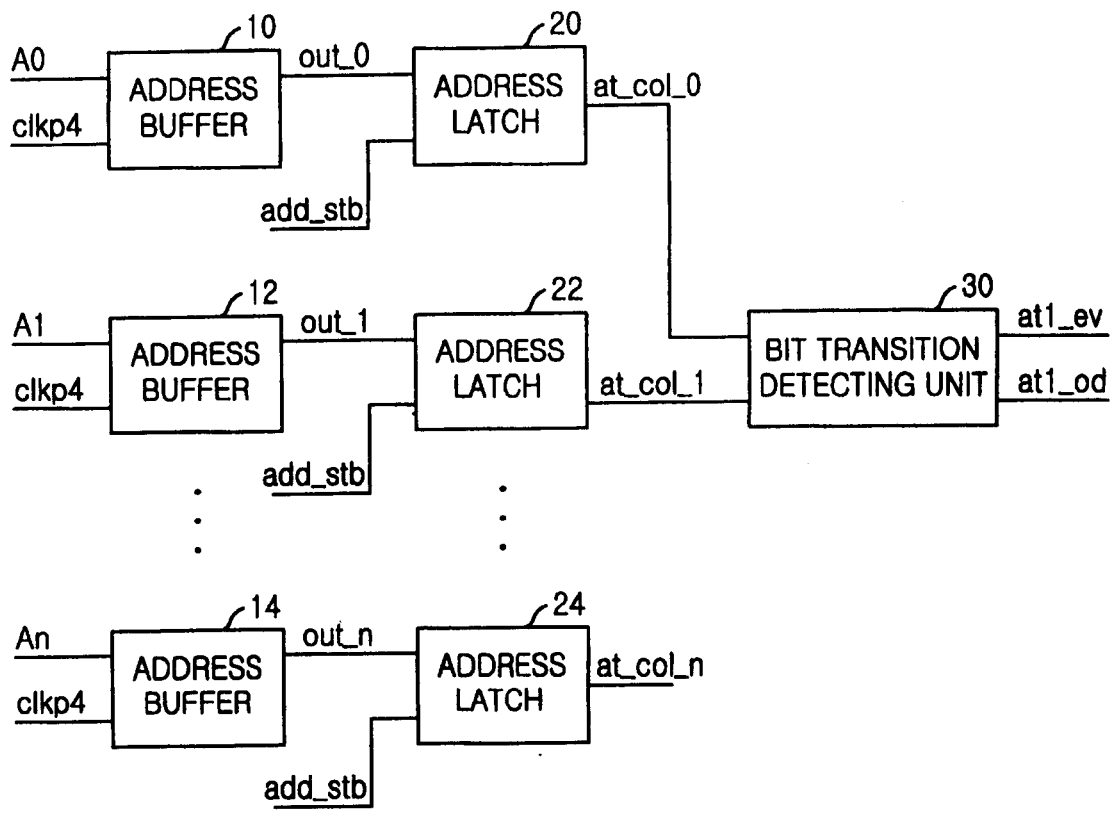
FIG. 1 is a block diagram of a conventional column address buffering circuit.
Figure 2:
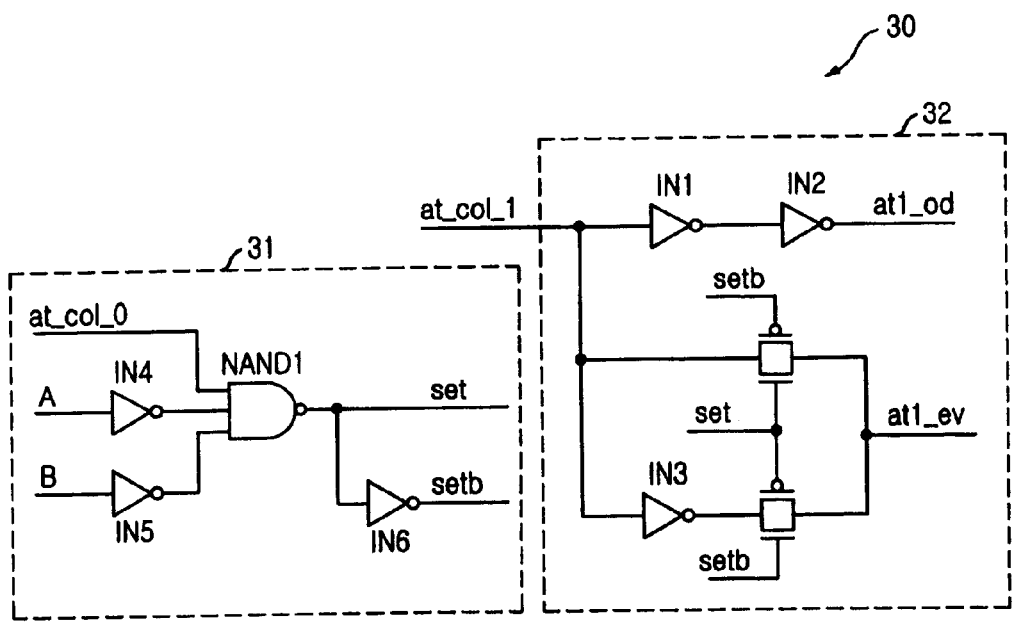
FIG. 2 is a circuit diagram of the bit transition detecting unit of FIG. 1.
Figure 3:
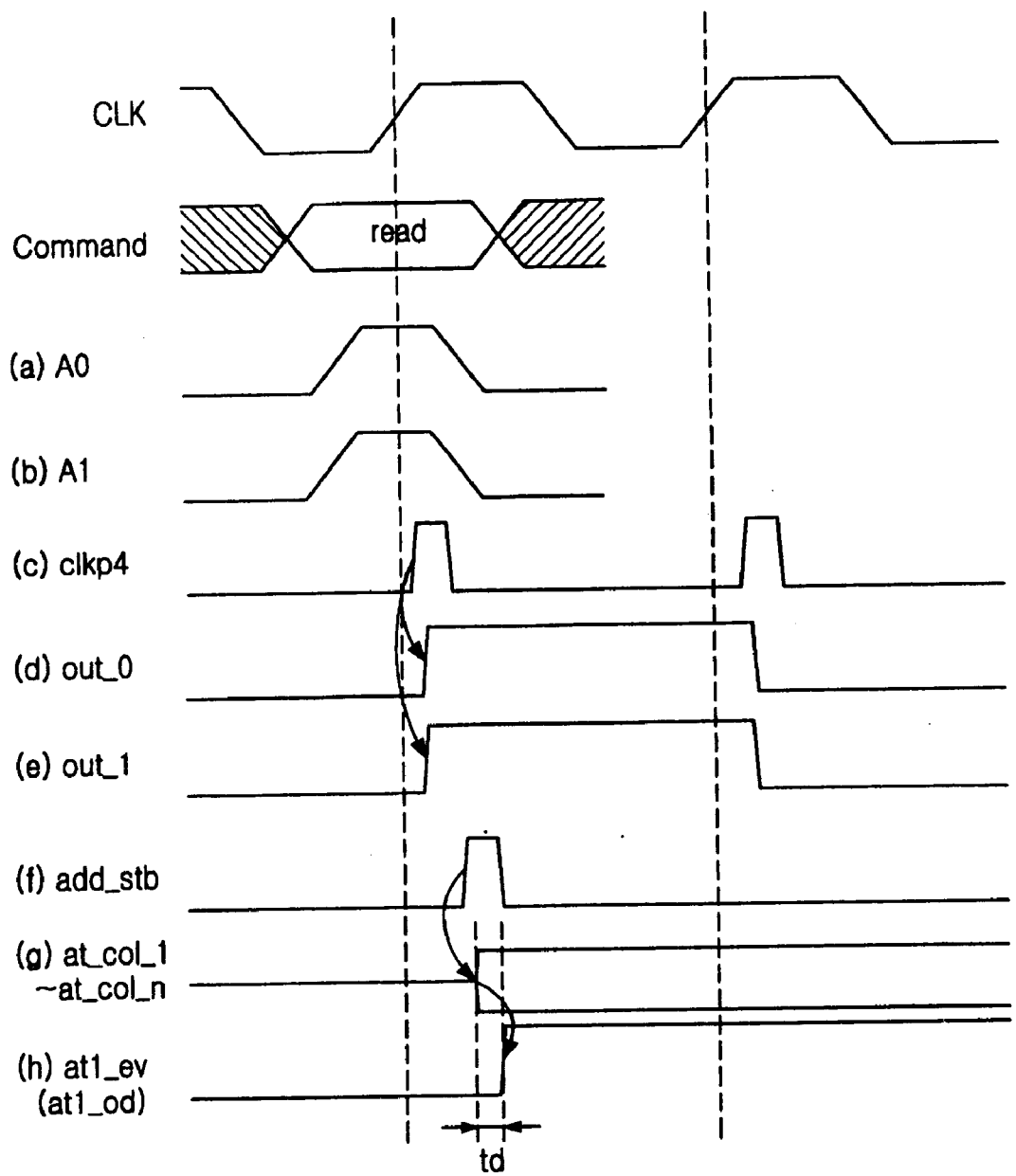
FIG. 3 is an operational timing diagram of the address buffering circuit of FIG. 1.
Figure 4:
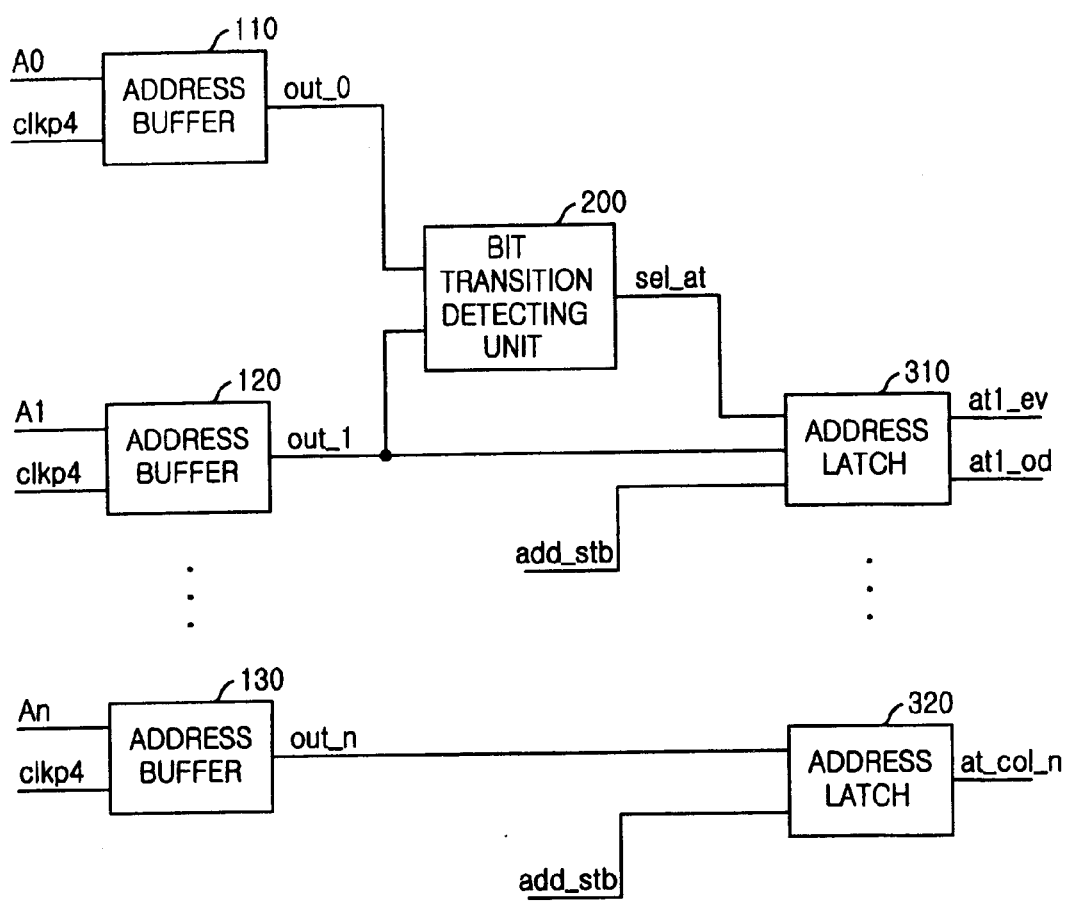
FIG. 4 is a block diagram of a column address buffering circuit.

Referring to FIG. 4, a block diagram of a column address buffering circuit is shown. The column address buffering circuit comprises a plurality of address buffers 110, 120, 130 for receiving and buffering column address signals A0, A1, An, a bit transition detecting unit 200 for outputting an internal signal sel_at for an even cell by using lower column address signals corresponding to a burst length and a multiplicity of address latches 310, 320 for receiving the internal signal sel_at and output signals of the address buffers 120–130 and providing internal address signals to following column predecoders.

Figure 5A:
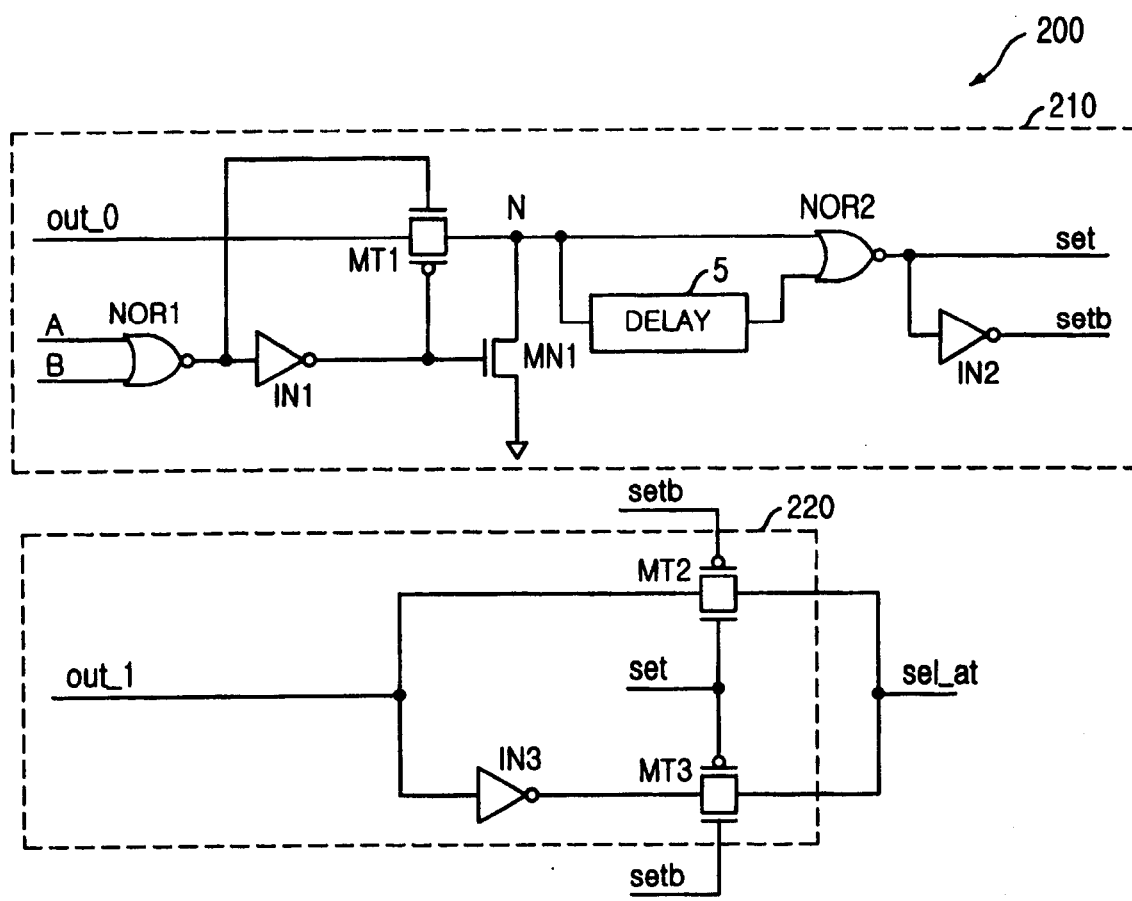
FIG. 5A is a circuit diagram of the bit transition detecting unit of FIG. 4.

As shown in FIG. 5A, the bit transition detecting unit 200 includes a control signal generating block 210 for producing a pair of control signals set and setb and an output block 220 for selectively providing the address latch 310 with the output signal out_1 of the address buffer 110 or an inverted signal of the output signal out_1 in response to the control signals set and setb.

The control signal generating block 210 includes a first NOR gate NOR 1 for logically summing input signals A and B, an inverter IN1 for inverting an output signal of the first NOR gate NOR1. The control signal generating block 210 further includes a first transmission gate MT1 for transferring the output signal out_0 of the address buffer 110, an NMOS transistor MN1 for connecting an output node N of the first transmission gate MT1, which is turned on when the input signals A and B having a low state are inputted, to a ground voltage node. The block 210 also includes a delay for delaying the output signal out_0 transferred through the first transmission gate MT1 for a preset time, a second NOR gate NOR2 for producing the control signal set based on a delayed signal outputted from the delay 5 and the output signal out_0 and an inverter IN2 for inverting the control signal set to thereby generate the inverted control signal setb.

Herein, the input signal A is produced to have a logic low state in case the burst length is 2 and a logic high state for other cases and the input signal B is generated to have a logic low state when a burst type is a sequential type and a logic high state in case the burst type is an interleave type.

The disclosure in connection with FIG. 5A is an example based on a burst length of 2. Accordingly, the bit transition detecting unit 200 is configured to internally process the address signal A1 by using the address signal A0 among the column address signals A0, A1, An.

The output unit 220 has second and a third transmission gates MT2 and MT3 for selectively providing the address latch 310 with the output signal out_1 or the inverted signal of the output signal out_1 as the internal signal sel_at according to logic states of the control signals set and setb.

Figure 5B:
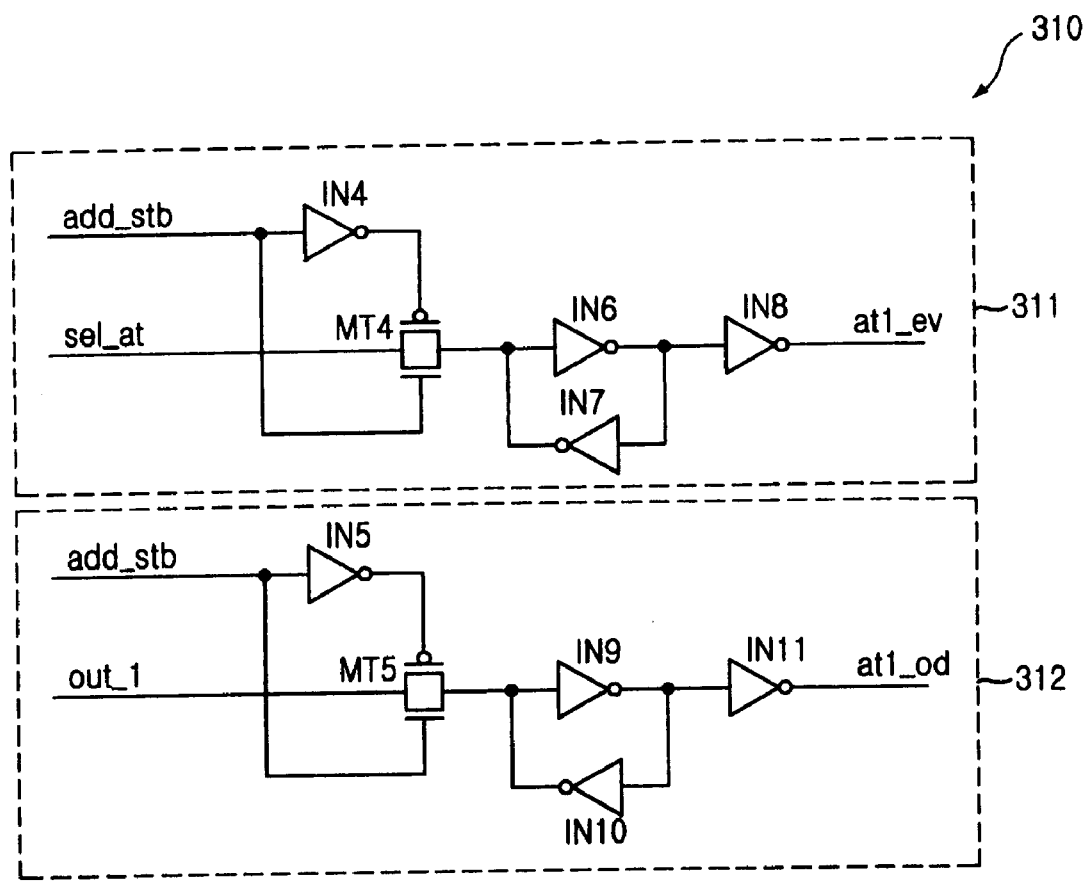
FIG. 5B is a circuit diagram of the address latch of FIG. 4.

As shown in FIG. 5B, an exemplary address latch 310 has an even cell address output block 311 for receiving the internal signal sel_at outputted from the bit transition detecting unit 200 in response to an address strobe signal add_stb, latching the internal signal sel_at and providing a following predecoder with an even address signal at1_ev. The address latch 310 also includes an odd cell address output block 312 for receiving the output signal out_1 in response to the address strobe signal add_stb, latching the signal out_1 and supplying a following predecoder with an odd address signal at1_od. Fourth and a fifth transmission gates MT4 and MT5 transfer the output signal sel_at of the bit transition detecting unit 200 and the output signal out_1 of the address buffer 120, respectively, responsive to the address strobe signal add_stb.

Figure 6:
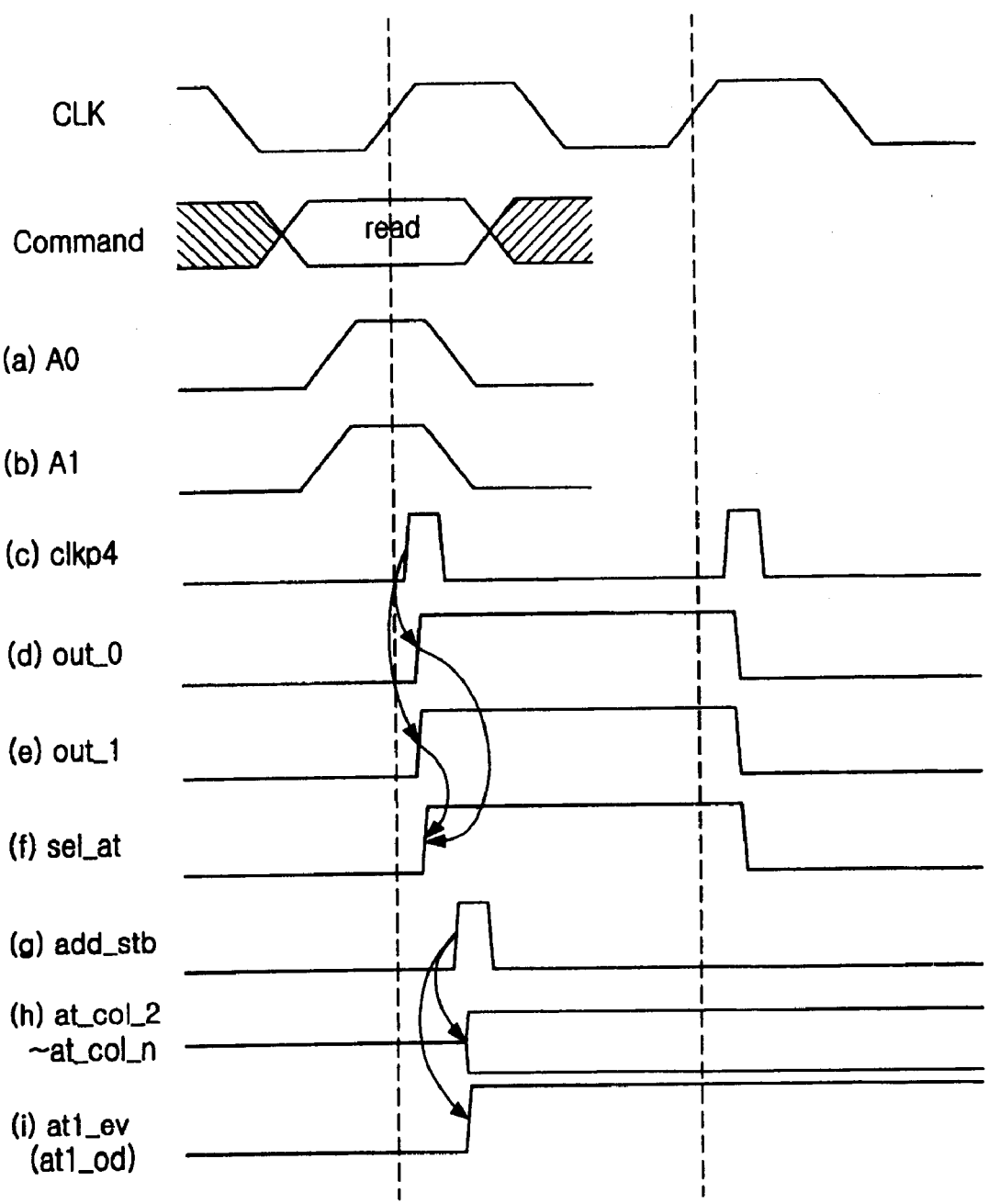
FIG. 6 is an operational timing diagram of the column address buffering circuit of FIG. 4.

The followings explains, in detail, the operation of the column address buffering circuit with reference to FIGS. 4 to 6. At first, the address buffers 110 and 120 receive the column address signals A0 and A1 and output the signals out_0 and out_1, respectively, in response to the internal clock control signal clkp4.

In the meantime, in the bit transition detecting unit 200, if at least one of the input signals A and B has a logic high state, the control signal generating block 210 always produces the control signals set and setb having a logic high state and a logic low state, respectively, and, thus, at the output block 220, the output signal out_1 is outputted as it is through the second transmission gate MT2.

Further, if both of the input signals A and B have a logic low state and the output signal out_0 of the address buffer 110 has a logic low state, the control signals set and setb are also outputted to have a logic high state and a logic low state, respectively and, thus, at the output block 220, the output signal out_1 is also outputted as it is through the second transmission gate MT2.

Conversely, if both of the input signals A and B have a logic low state and the output signal out_0 of the address buffer 110 has a logic high state, the control signals set and setb are outputted to have a logic low state and a logic high state, respectively and, thus, at the output block 220, the inverted signal of the output signal out_1 is outputted as the internal signal sel_at through the third transmission gate MT3.

According to the operational timing diagram of the column address buffering circuit shown in FIG. 6, if the column address signals A0 and A1 having the waveform of (a) and (b) are inputted, two output signals out_0 and out_1 having the waveform of (d) and (e) are simultaneously generated in synchronization with a rising-edge of the internal clock control signal clkp4 described at (c). At this time, the bit transition detecting unit 200 produces the signal sel_at having the waveform of (f) determined by changing the logic state of the output signal out_1 according to the logic state of the output signal out_0.

Then, the address latch 310 transfers the internal signal sel_at outputted from the bit transition detecting unit 200 to a following predecoder (not shown) in response to the address strobe signal add_stb. Another address latch (e.g., 320) generates an output signal (e.g., at_col_n) to its following predecoder responsive to the address strobe signal add_stb.

As a result, because the generation of the internal column address signals described at (h) and (i) is performed in synchronization with the generation of the address strobe signal add_stb shown at (g), it is possible to eliminate the delay time unnecessarily spent after the address strobe signal add_stb is inputted in the conventional column address buffering circuit.

Figure 7:
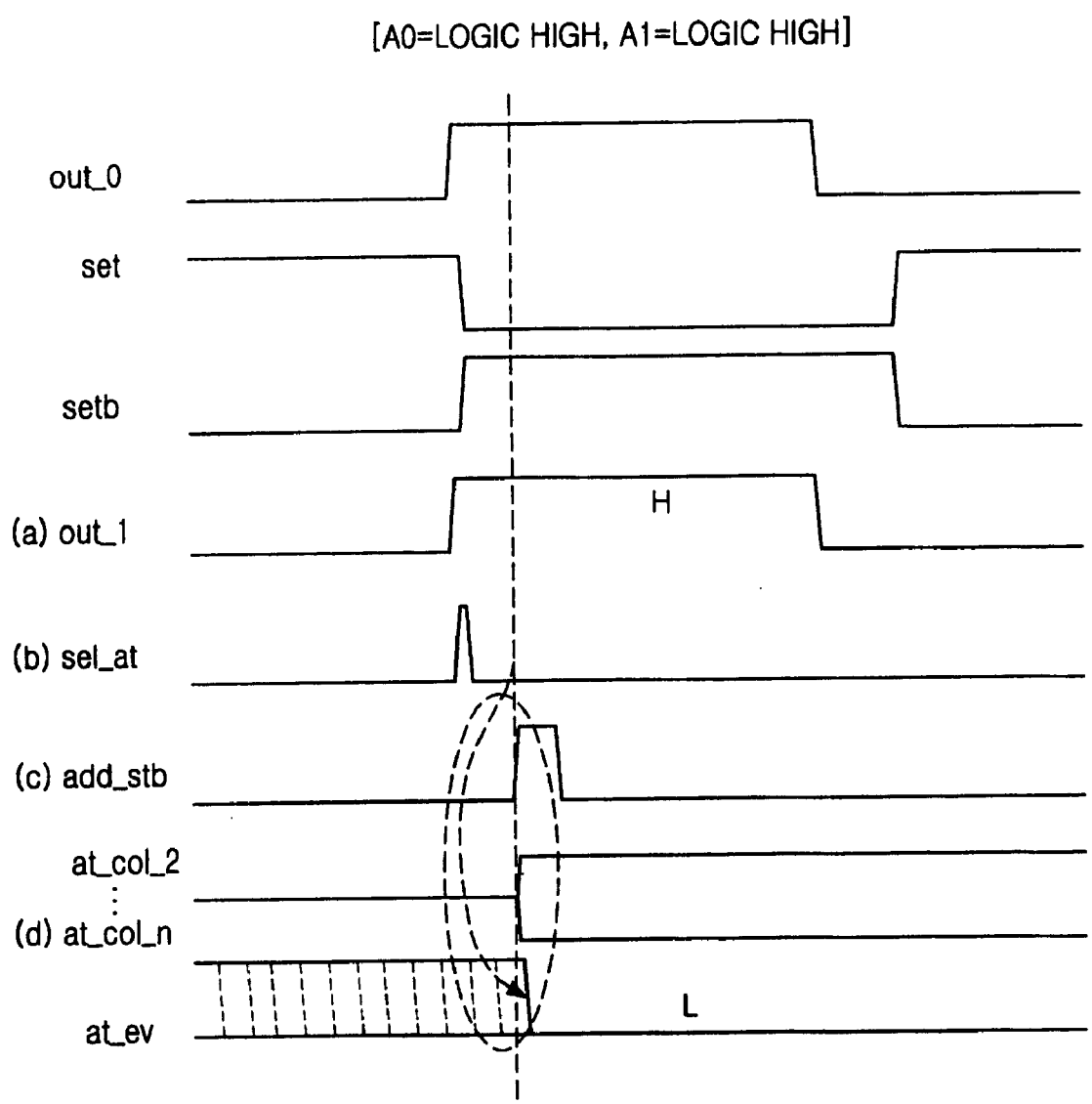
FIGS. 7 and 8 are operational timing diagrams of the bit transition detecting unit of FIG. 4 according to a bit transition detecting state.
Figure 8:
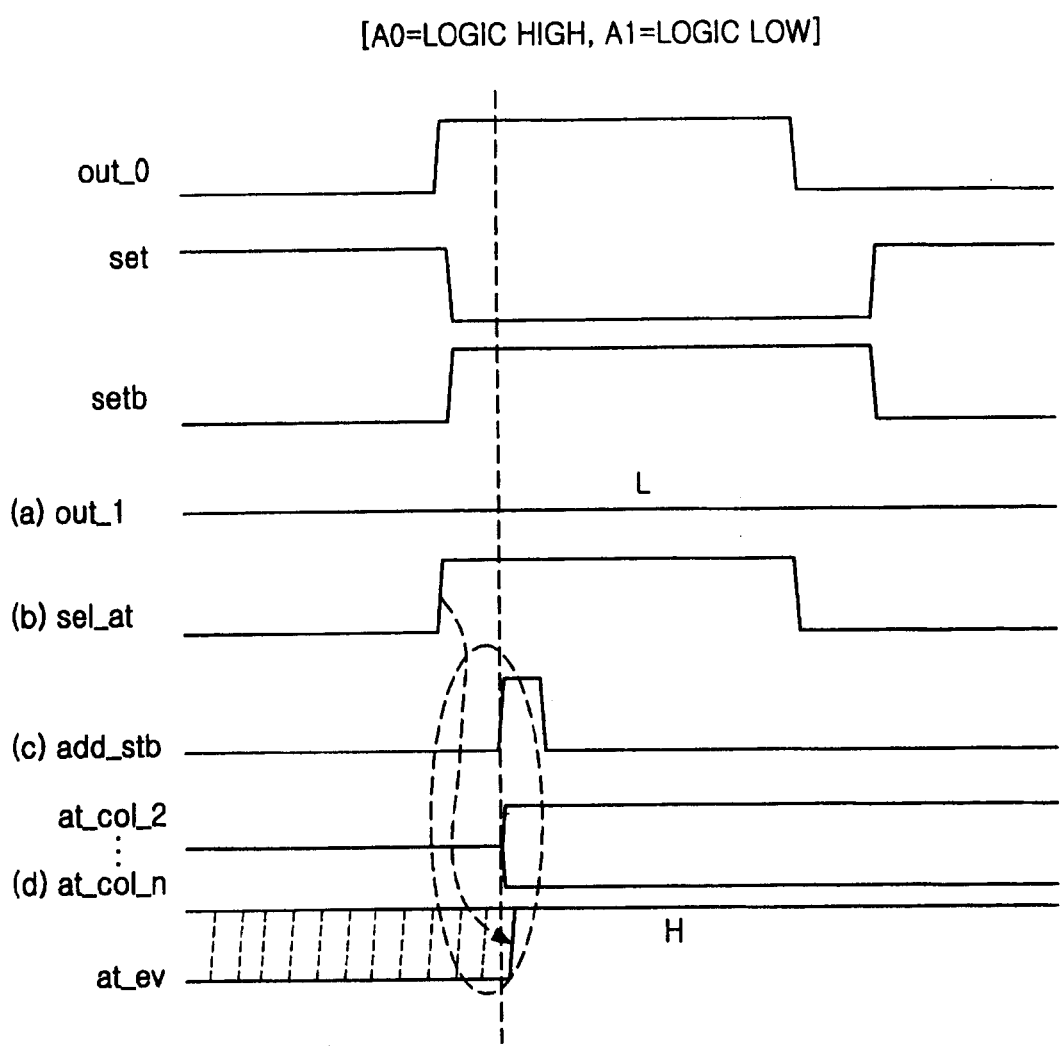

FIGS. 7 and 8 show operational timing diagrams of the bit transition detecting unit 200 in FIG. 4 according to a bit transition detecting state. In FIG. 7, there is described a timing diagram in case both of the address signals A0 and A1 have a logic high state. On the other hand, in FIG. 8, there is illustrated a timing diagram in case the address signals A0 and A1 have a logic high state and a logic low state, respectively.

Referring to FIG. 7, the inverted signal of the output signal out_1 is outputted as the internal address signal at1_ev by the internal signal sel_at generated prior to the address strobe signal add_stb is actuated. That is, the upper address signal out_1 is inverted from the logic high state to the logic low state and outputted.

Referring to FIG. 8, the inverted signal of the output signal out_1 is outputted as the signal at1_ev by the internal signal sel_at produced prior to the address strobe signal add_stb is enabled.

Figure 9:
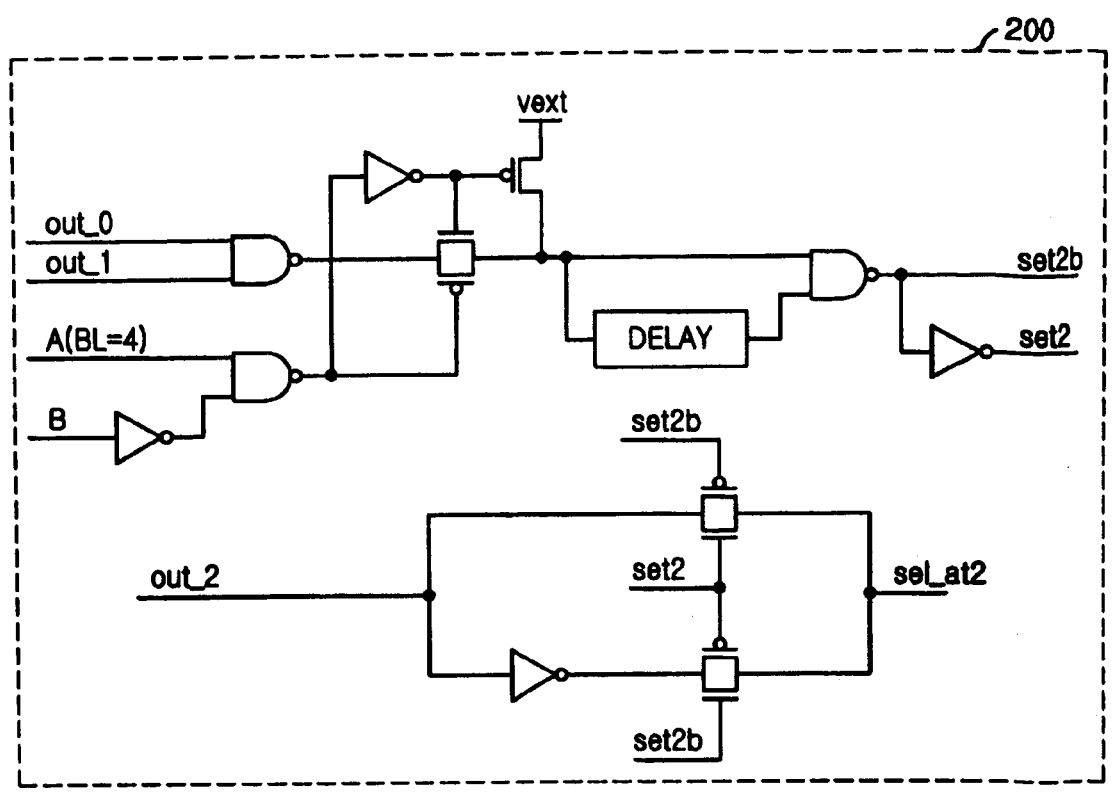
FIG. 9 is a circuit diagram of the bit transition detecting unit of FIG. 4.

Moreover, the column address buffering circuit disclosed herein is not limited to the burst length of 2. That is, it can be applicable to other burst lengths. For example, in case the burst length is 4, the disclosed circuit detects the logic states of the column address signals A1 and A0 to thereby internally process a column address signal A2. In this case, because a signal is internally inverted by the column address signals A0 and A1 when A0 has a logic high state and A1 has a logic high state, the column address buffering circuit is configured to invert an internal signal out_2 generated by a column address signal A2 when both of A1 and A0 have a logic high state. FIG. 9 shows a circuit diagram of the bit transition detecting unit 200 in FIG. 4 in case the burst length is 4.

The disclosed column address buffering circuit reduces the generation time of the internal column address signals and, thus, the column access time of a memory device such as a synchronous semiconductor device can be substantially reduced.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A column address buffering apparatus comprising:
   a plurality of address buffers for receiving and buffering column address signals to thereby output buffered column address signals;

a bit transition detecting units for receiving lower bit address signals corresponding to a burst length among the buffered column address signals and for selectively outputting a most significant bit address signal among the lower bit address signals or an inverted signal of the most significant bit address signal according to logic states of the rest of the lower bit address signals;

a first address latch for supplying corresponding following predecoders with an output signal of the bit transition detecting unit in response to an address strobe signal; and a second address latch for receiving buffered address signals that do not correspond to the burst length among the buffered address signals and for providing corresponding following predecoders with the received buffered address signals in response to the address strobe signal.

2. The column address buffering apparatus of claim 1, wherein the bit transition detecting unit includes:

a control signal generating block for producing a control signal determining whether or not to invert the most significant bit address signal by logically combining the lower bit address signals, a first input signal determined by the burst length and a second input signal decided by a burst type; and an output block for outputting the most significant bit address signal or the inverted signal of the most significant bit address signal in response to said control signal.

3. The column address buffering apparatus of claim 2, wherein the control signal generating block includes:

a first switch for transferring a logically combined signal of the lower bit address signals in response to the first input signal and the second input signal;

a second switch for constantly maintaining the potential of an output node of the first switching means when the first switching means is turned off; and a control signal output block for producing the control signal when an output signal of the first switching means is constantly sustained for a preset time.

4. The column address buffering apparatus of claim 3, wherein the first switch contains:

a NOR gate for logically summing the first input signal and the second input signal;

an inverter for inverting an output signal of the NOR gate; and a transmission gate operating in response to the output signal of the NOR gate and an output signal of the inverter.

5. The column address buffering apparatus of claim 4, wherein the second switch employs a MOS transistor whose gate is provided with the output signal of the inverter and which is turned on to make an output signal of the transmission gate maintain a prescribed voltage level when the transmission gate is disabled.

6. The column address buffering apparatus of claim 5, wherein the control signal output block comprises:

a delay block for delaying the output signal of the transmission gate for a predetermined time; and a control signal provider for generating the control signal if the delayed signal outputted from the delay block and the output signal of the transmission gate maintain an identical logic state with each other for a prescribed time.

7. The column address buffering apparatus of claim 2, wherein the output block of the bit transition detecting unit contains:

an inverter for inverting the most significant bit address signal to thereby produce the inverted signal of the most significant bit address signal;

a first transmission gate for transferring the most significant bit address signal to the first address latch when the control signal is enabled; and a second transmission gate for delivering the inverted signal of the most significant bit address signal to the first address latch when the control signal is disabled.

8. The column address buffering apparatus of claim 3, wherein the first address latch includes:

a third switch for transferring an output signal of the output block in response to the address strobe signal; and a latch for latching and outputting an output signal of the third switch.

* * * * *